United States Patent [19]

Makiuchi

[11] Patent Number: 5,309,468
[45] Date of Patent: May 3, 1994

[54] LASER DIODE FOR PRODUCING AN OUTPUT OPTICAL BEAM IN A DIRECTION SUBSTANTIALLY PERPENDICULAR TO EPITAXIAL LAYERS

[75] Inventor: Masao Makiuchi, Kawasaki, Japan
[73] Assignee: Fujitsu Limited, Kawasaki, Japan
[21] Appl. No.: 883,027
[22] Filed: May 14, 1992

[30] Foreign Application Priority Data

May 15, 1991 [JP] Japan .................................. 3-109952
Jan. 30, 1992 [JP] Japan .................................. 4-14689

[51] Int. Cl.$^5$ ............................................. H01S 3/19
[52] U.S. Cl. ........................................ 372/50; 372/45;
    372/46; 372/92; 372/99
[58] Field of Search .................. 372/50, 45, 46, 92, 372/99

[56] References Cited

U.S. PATENT DOCUMENTS 4,935,939  6/1990  Liau et al. ............................. 372/98

FOREIGN PATENT DOCUMENTS 63-76390  4/1988  Japan .
2-113524  4/1990  Japan .

OTHER PUBLICATIONS

Jack Jewell et al., "Microlasers", *Scientific American*, Nov. 1991 pp. 86-94.
S. Uchiyama et al., "GaInAsP/InP Surface-Emitting Lasers with Current Confining Structure," *Journal of Lightwave Technology*, vol. LT-4, No. 7, Jul. 1986, New York, NY, pp. 846-850.
*Patent Abstracts of Japan*, vol. 12, No. 308 (E-647) Aug. 22, 1988 & JP-A-63 76390 (Nec Corp) Jun. 4, 1988.
*Patent Abstracts of Japan*, vol. 13, No. 381 (E-810) Aug. 23, 1989 & JP-A-1 130578 (Iwasaki Electric Ind) May 23, 1989.
*Patent Abstracts of Japan*, vol. 14, No. 336 (E-953) Jul. 19, 1990 & JP-A-2 113524 (Hitachi Ltd) Apr. 25, 1990.
K. Rastani et al., "Arrays of Focused Beams Generated by the Integration of Fresnel Microlenses with Vertical Cavity Surface-Emitting Laser Arrays," *Technical Digest Series, Spatial Light Modulators and Applications Topical Meeting, Optical Society of America*, vol. 14, Sep. 10, 1990, Washington, DC, pp. 76-79.
M. Makiuchi et al., "High-Speed Monolithic GaInAs Twin PIN Photodiodes for Coherent Optical Receivers," *Fujitsu-Scientific and Technical Journal*, vol. 27, No. 1, Apr. 1991, Kawasaki, JP, pp. 84-90.

Primary Examiner—James W. Davie
Attorney, Agent, or Firm—Staas & Halsey

[57] ABSTRACT

A laser diode for producing an optical beam in a direction substantially perpendicular to epitaxial layers. The laser diode comprises a substrate, a disc-shaped active layer provided epitaxially on the substrate for producing an optical beam as a result of the stimulated emission, a disc-shaped contact layer provided epitaxially on the active layer for injecting carriers into the active layer, an optical confinement layer provided on the substrate to surround the active layer and the contact layer laterally for confining the optical beam in the active layer, a convex mirror part provided on a lower major surface of the substrate for reflecting back the optical beam such that the optical beam is converged to the active layer, an opposing mirror part provided in correspondence to an upper major surface of the contact layer, a first electrode provided on the contact layer for injecting carriers of a first polarity, a second electrode provided on the lower major surface of the substrate for injecting carriers of a second polarity, and an optical passage provided in correspondence to the spherical surface of the convex lens part for emitting the optical beam as a parallel beam.

18 Claims, 10 Drawing Sheets

LASER DIODE FOR PRODUCING AN OUTPUT OPTICAL BEAM IN A DIRECTION SUBSTANTIALLY PERPENDICULAR TO EPITAXIAL LAYERS

BACKGROUND OF THE INVENTION

The present invention generally relates to semiconductor devices, and more particularly to a laser diode that produces an optical beam in a direction substantially perpendicular to the epitaxial layers that form the laser diode.

In the laser diode, the cleaved surface of the epitaxial layers is used generally for forming the optical cavity. In such ordinary laser diodes, therefore, the optical beam is produced in the direction substantially perpendicular to the cleaved surfaces and hence in the direction substantially parallel to the epitaxial layers. In the mass production of such ordinary laser diodes, there arises a problem in that each laser diode has to be tested individually. However, such a testing process takes a substantial time and increases the cost of the device.

On the other hand, there is proposed a laser diode called surface radiation type that produces the output optical beam in the direction substantially perpendicular to the epitaxial layers that form the laser diode. In this type of laser diode, it is possible to carry out the test of the devices in the state that the devices are formed on a wafer. More specifically, the test of the laser diodes is achieved efficiently by moving a probe of the testing machine over the surface of the wafer. Thereby, the cost of the device can be reduced substantially.

Such a surface radiation type laser diode is useful also in constructing various processing systems and computers by stacking a number of circuit boards that carry thereon various semiconductor devices. By using the surface radiation type laser diodes, the interconnection between the circuit boards can be achieved easily and efficiently by the optical beam. Further, by arranging such laser diodes in the form of a row and column array, one can represent an image by a luminescent pattern. Such an arrangement is useful in restoring an image that has experienced modification during transmission.

Figure 1A:
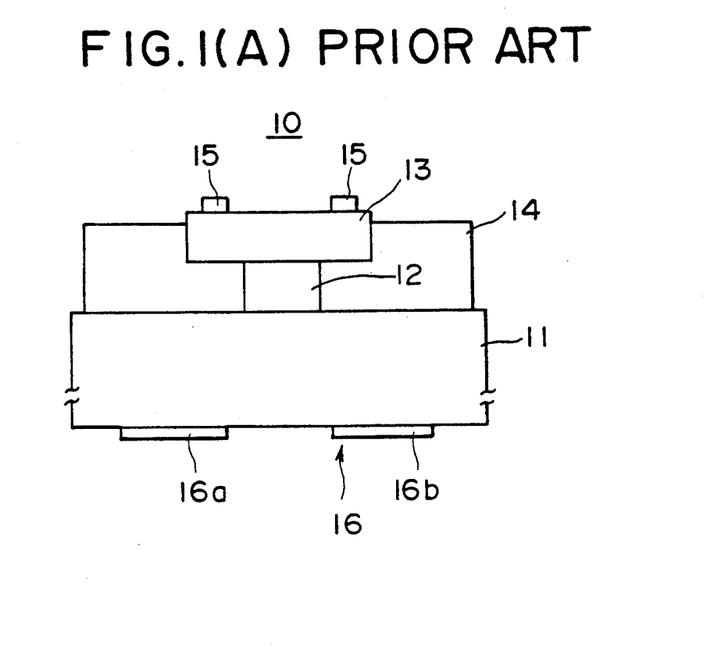
FIGS. 1(A) and 1(B) are diagrams showing a conventional surface radiation type laser diode respectively in a cross sectional view and in a plan view.
Figure 1B:
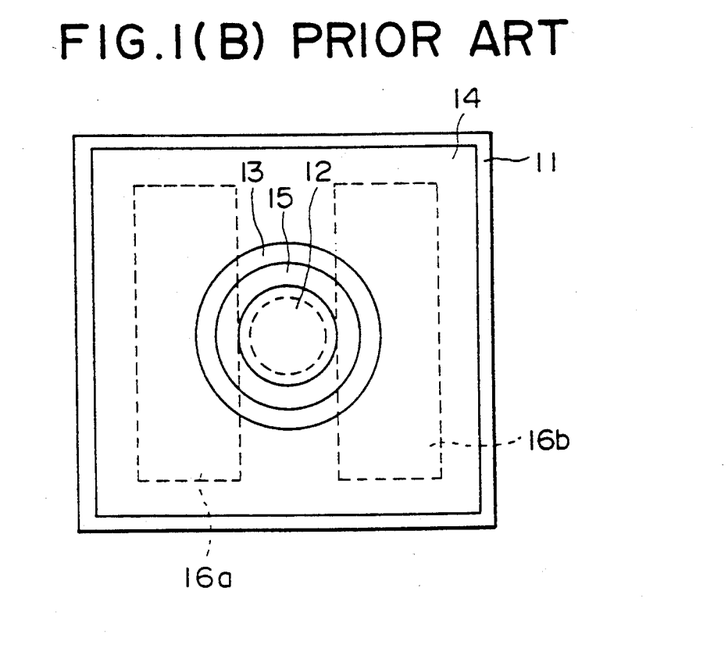

FIG. 1(A) shows a conventional surface radiation type laser diode 10 in the cross sectional view while FIG. 1(B) shows the same device in the plan view.

Referring to FIGS. 1(A) and 1(B), the laser diode includes a substrate 11 of an InP doped to the n+-type. On the substrate 11, there is provided an active layer of undoped InGaAs grown epitaxially on the substrate 11. As shown in the plan view of FIG. 1(B), the active layer 12 has a cylindrical form with a reduced diameter for concentrating carriers therein to achieve an efficient stimulated emission. On the upper major surface of the active layer 12, there is provided a contact layer 13 of InP doped to the P+-type. Further, the active layer 12 is supported laterally by an insulating layer 14 that may be a resin such as polyimide or a semiconductor material processed to become unconductive. Further, there is provided a ring-shaped ohmic electrode 15 on the upper major surface of the contact layer 13. There, the electrode 15 defines an exposed upper major surface of the layer 13. Similarly, there is provided another ohmic electrode 16 at the lower major surface of the substrate 11. As shown in the plan view of FIG. 1B), the electrode 16 includes two rectangular conductor pieces separated from each other in correspondence to the active layer 12. Thereby, there is defined an exposed lower major surface of the substrate 11 between the two electrode pieces 16a and 16b. The exposed upper major surface of the contact layer 13 as well as the exposed lower major surface of the substrate 11 provides a passage of the optical beam that is produced by the laser diode. Thereby, the optical beam exits in the direction perpendicular to the epitaxial layers.

In the laser diode of FIG. 1(A), it will be noted that there is formed a pair of opposing mirror surfaces respectively in correspondence to the interface between the substrate 11 and the active layer 12 and in correspondence to the exposed upper major surface of the contact layer 13. Thereby, there is formed an optical cavity in correspondence to the active layer 12 and the contact layer 13, and the optical radiation produced in the active layer 12 is amplified by the stimulated emission as it is reflected back and forth between the two opposing mirror surfaces. The optical beam thus produced as a result of the stimulated emission exits through the exposed upper major surfaces of the contact layer 13 as well as through the exposed lower major surface of the substrate 11 in the direction perpendicular to the epitaxial layers as already mentioned.

In the laser diode 10 shown in FIGS. 1(A) and 1(B), the difference in the refractive index between the substrate 11 and the active layer 12 is not large enough to cause a sufficient optical feedback. In order to obtain a more strong reflection, it is preferable to use the exposed lower major surface of the substrate 11 for the mirror. On the other hand, the distance between the two opposing mirrors of the optical cavity is determined by the wavelength of the optical radiation and thus, there can be a case in which the use of the lower surface of the substrate 11 as the mirror is not possible.

Figure 2:
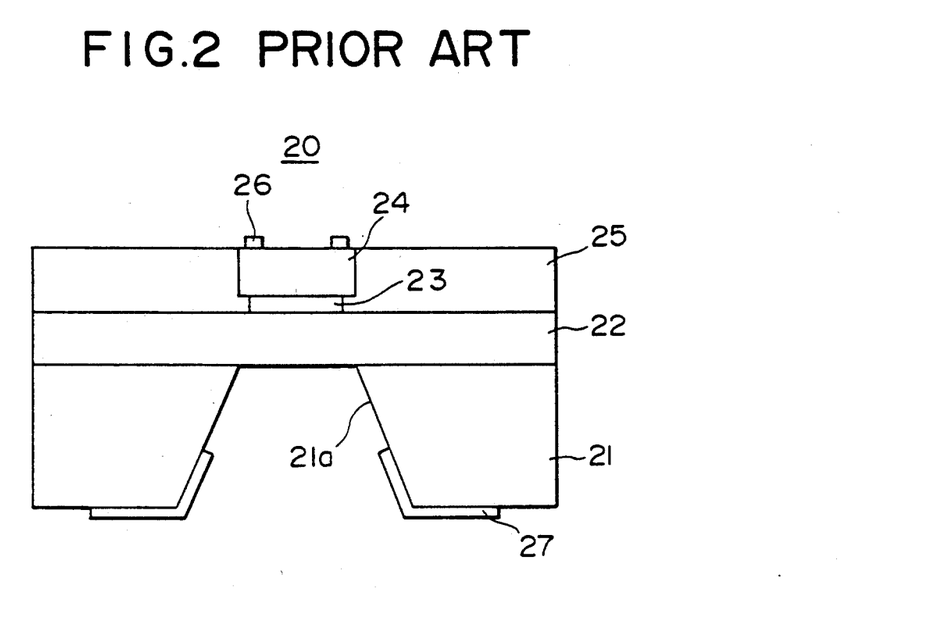
FIG. 2 is a diagram showing another conventional surface radiation type laser diode in a cross sectional view.

FIG. 2 shows an example device 20 that has a construction for achieving a stronger reflection in the optical cavity.

Referring to FIG. 2, the device 20 has a construction similar to the device 10 in that the device is constructed on a substrate 21 corresponding to the substrate 11. On the substrate 21, there is provided a buffer layer 22 of n+-type InP, and an active layer 23 corresponding to the active layer 12 is provided on the buffer layer 22. Further, a contact layer 24 corresponding to the contact layer 13 is provided on the active layer 23 and a ring shaped electrode 26 is provided on the contact layer 13 in correspondence to the electrode 15. The active layer 23 as well as the contact layer 24 are surrounded laterally by an insulator layer 25 that corresponds to the insulator layer 14.

In the device 20 of FIG. 2, there is provided an opening 21a on the lower major surface of the substrate 21 such that the opening 21a exposes the lower major surface of the buffer layer 22. Thereby, there are formed two opposing mirror surfaces, one in correspondence to the exposed upper major surface of the contact layer 24 and the other in correspondence to the exposed lower major surface of the buffer layer 22. By setting the thickness of the layers 22, 23 and 24 appropriately, it is possible to obtain a strong laser oscillation by the device of FIG. 2.

Figure 3:
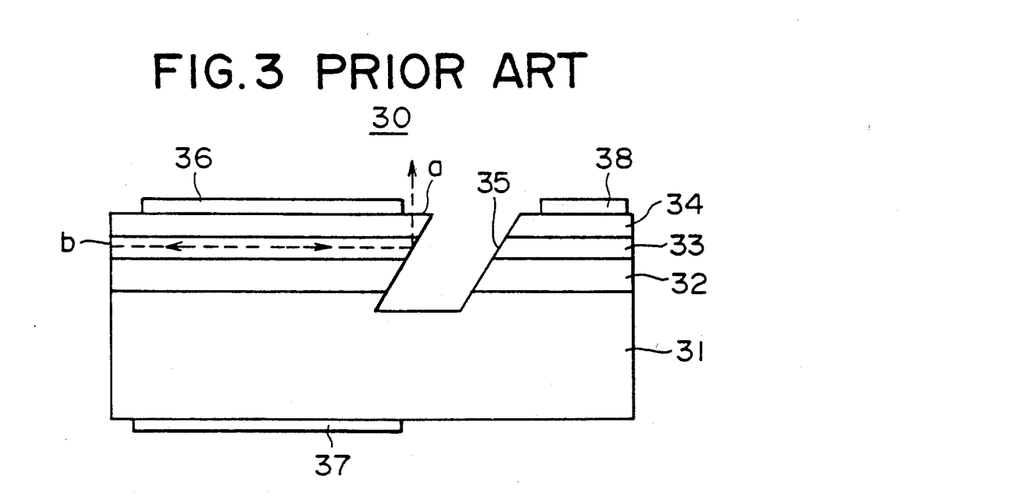
FIG. 3 is a diagram showing still another conventional surface radiation type laser diode in a cross sectional view.

FIG. 3 shows another conventionally proposed laser diode 30 that produces the optical beam in the direction perpendicular to the epitaxial layers.

Referring to FIG. 3, the laser diode 30 is constructed on a substrate 31 corresponding to the substrate 21 of the device 20 of FIG. 2, and there is provided a buffer layer 32 corresponding to the buffer layer 22 on the substrate 31. On the buffer layer 32, there is provided an active layer 33 similar to the active layer 23 except that the active layer 33 covers the entire upper major surface of the buffer layer 32. Further, a contact layer 34 corresponding to the contact layer 24 is provided to cover the entire upper major surface of the active layer 34. On the upper major surface of the contact layer 34, there is provided an ohmic electrode 36 while there is provided an ohmic electrode 37 on the lower major surface of the substrate 31.

Thus, the device 30 of FIG. 3 has a structure similar to the usual laser diode that uses the cleaved surfaces for the optical cavity, except that there is provided an oblique groove 35 that cuts the active layer 33 with an angle of 45 degrees. There, the optical beam that is produced in the active layer 33 is bent perpendicularly upon reflection at the surface of the groove 35 and the optical beam exits in the direction perpendicular to the upper major surface of the layer 34. Thereby, the cleaved surface b and the upper major surface a of the layer 34 act as the mirror surfaces for reflecting the optical beam back and forth for the optical amplification. Obviously, this device requires the cleaving process in order that the device becomes operational. In other words, device 30 is not suitable for the testing in the as-formed state.

In any of the devices 10 and 20, it should be noted that the active layer 12 or 23 has a reduced diameter in the order of 4–10 μm for concentrating the carriers therein. Thereby, although such a construction may be preferable for decreasing the threshold of laser oscillation, there arises a problem that the optical beam tends to be spread with a large solid angle. In other words, it is difficult with these devices to obtain a highly coherent parallel optical beam that is preferable for various applications. Further, such a spreading of the optical beam occurs also in the buffer layer 22 when the optical beam exits from the active layer that is surrounded by the insulator layer 25 that has a low refractive index. It should be noted that the optical confinement achieved in the active layer by the insulator layer 25 does not occur in the buffer layer 22 that lacks the low refractive index layer. Thereby, the divergent optical beam is spread each time it is reflected back at the exposed lower major surface of the buffer layer 22, and the efficiency of laser oscillation is inevitably deteriorated.

SUMMARY OF THE INVENTION

Accordingly, it is a general object of the present invention to provide a novel and useful laser diode, wherein the foregoing problems are eliminated.

Another and more specific object of the present invention is to provide a laser diode that produces a substantially parallel output optical beam in a direction perpendicular to the epitaxial layers of the laser diode.

Another object of the present invention is to provide a laser diode that produces an output optical beam in a direction perpendicular to the epitaxial layers of the laser diode with an improved efficiency of laser oscillation.

Another object of the present invention is to provide a laser diode comprising a substrate having an upper major surface and a lower major surface, said substrate comprising a first semiconductor material having a first conductivity type, said substrate being surrounded by a first side wall with a first lateral size; an active layer having an upper major surface and a lower major surface and provided on said upper major surface of said substrate, said active layer being surrounded by a second side wall and having a second lateral size that is substantially smaller than said first lateral size, said active layer comprising an undoped single crystal of a second semiconductor material different from said first semiconductor material and producing an optical beam by a stimulated emission; a contact layer having an upper major surface and a lower major surface and provided on said upper major surface of said active layer, said contact layer being surrounded by a third side wall and having a third lateral size substantially smaller than said first lateral size, said contact layer comprising a third semiconductor material different from said second semiconductor material and doped to said first conductivity type, said upper major surface of said contact layer acting as a mirror surface for reflecting back said optical beam produced in said active layer; optical confinement means provided on said upper major surface of said substrate in contact with said second and third side walls for confining said optical beam in said active layer and in said contact layer; a convex lens part provided on said lower major surface of said substrate to protrude outward from said substrate in a direction substantially perpendicular to said lower major surface of said substrate, said convex lens part comprising a spherical mirror surface for reflecting back said optical beam and concentrating the same in said active layer; first electrode means provided on said upper major surface of said contact layer for injecting carriers of a first polarity; second electrode means provided on said lower major surface of substrate for injecting carriers of a second, opposite polarity; and optical passage means provided at least on one of said spherical surface of said convex lens part and said upper major surface of said contact layer for emitting said optical beam. According to the present invention, the optical beam is reflected back and forth between said upper major surface of said contact layer and said spherical surface. Thereby, the optical beam is concentrated in said active layer even when the optical beam is spread by the diffraction upon exiting from the active layer to the substrate. Such an increased optical intensity in the active layer of course increases the efficiency of stimulated emission occurring in the active layer. Further, by providing the optical passage means in correspondence to the spherical surface of the convex lens part, it is possible to form the optical beam as a parallel optical beam having a large beam diameter. Thereby, such an optical beam spreads little by the diffraction and propagates straight without losing intensity substantially.

Other objects and further features of the present invention will become apparent from the following detailed description when read in conjunction with the attached drawings.

DETAILED DESCRIPTION OF THE PREFERRED EMBODIMENTS

Figures 4A, 4B:
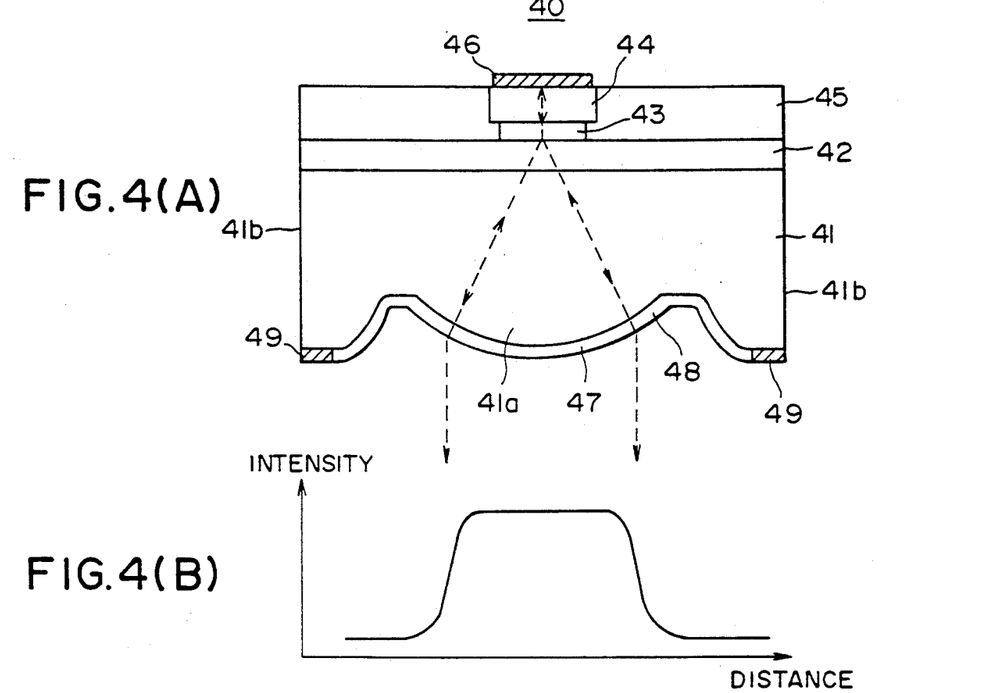
FIG. 4(A) is a diagram showing a surface radiation type laser diode according to a first embodiment of the present invention.
FIG. 4(B) is a diagram showing the intensity profile of the optical beam obtained by the device of FIG. 4(A)
Figure 4C:
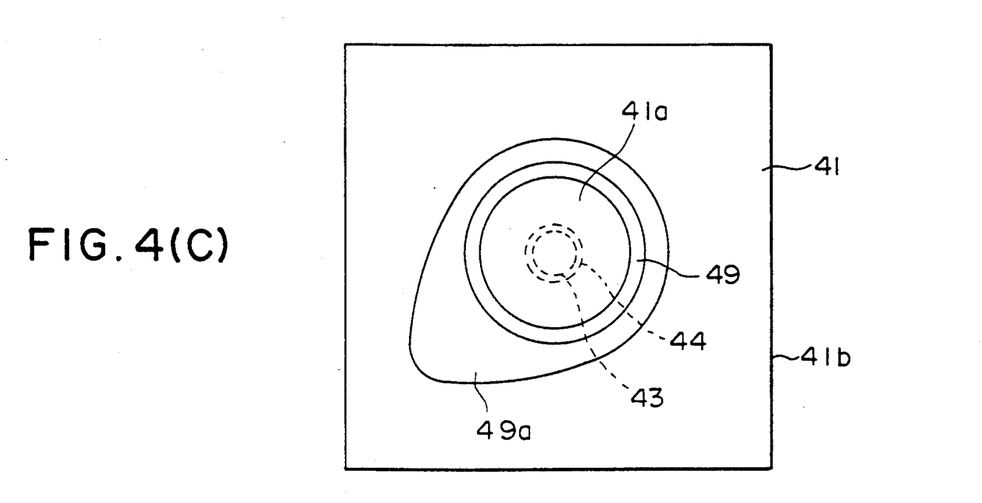
FIG. 4(C) is diagram showing the device of FIG. 4(A) in a bottom view.

FIG. 4(A) shows a laser diode 40 according to a first embodiment of the present invention in a cross sectional view, while FIG. 4(C) shows the same laser diode 40 in a bottom view.

Referring to FIG. 4(A), the device 40 is constructed on a single crystal substrate 41 of n+-type InP substrate 41 that has an upper major surface covered by a buffer layer 42 of n+-type InP grown on the substrate 41 epitaxially. The substrate 41 has a thickness of 150-170 μm and has a lower major surface on which a microlens 41a that forms the essential part of the present invention is provided with a diameter of about 80 μm. There, the microlens 41a has a spherical surface with a radius of curvature of about 100-120 μm and protrudes in the downward direction with a distance of about 7-10 μm. The buffer layer 42, on the other hand, has substantially flat upper and lower major surfaces separated with a thickness of about 2 μm and has an impurity concentration level of $1 \times 10^{18}$ cm$^{-3}$ — $7 \times 10^{18}$ cm$^{-3}$.

On the buffer layer 42, there is provided an active layer 43 of undoped InGaAs epitaxially with a thickness of less than 0.5 μm. The active layer 43 is formed into a disc and is surrounded by a side wall. See the bottom view of FIG. 4(C). There, the active layer 43 has a diameter of 4-10 μm. In response to the formation of the disc shaped active layer 43, the upper major surface of the buffer layer 42 is exposed except for the part that is covered by the layer 43.

On the upper major surface of the active layer 43, there is provided a contact layer 44 of p+-type InP with a thickness of about 2 μm. The contact layer 44 is formed also into a disc as shown in FIG. 4(C), wherein the layer 44 has a diameter slightly larger than the diameter of the active layer 43. Thereby, the contact layer covers the entire upper major surface of the active layer 43 In this construction, it should be noted that there is formed a PIN junction along the layer 44, layer 43 and the layer 42. Further, the exposed part of the buffer layer 45 is covered by an insulator layer 45 such as polyimide such that the insulator layer 45 supports the side wall of the layers 43 and 44 laterally.

On the upper major surface of the contact layer 44, there is provided an ohmic electrode 46 in ohmic contact with the p+-type InP layer 44. As usual, an alloy of Au-Zn/Au is used for the electrode 46. On the lower major surface of the substrate 41, on the other hand, there is provided a ring-formed ohmic electrode 49 to surround the microlens 41a. See FIG. 4(C). An alloy of Au-Ge/Au is used for the electrode 49 as is the common practice. Further, there is provided a bonding pad 49a on the lower major surface of the substrate 41 to surround the electrode 49 as shown in the bottom view of FIG. 4(C). It will be noted that the bottom view of FIG. 4(C) shows that the substrate 41 is surrounded by a side wall 41b in correspondence to the state after the laser diode is diced into individual devices from a wafer.

In operation, a positive bias voltage is applied to the electrode 46 for injecting holes into the active layer 43 through the contact layer 44 while a negative bias voltage is applied to the electrode 49 for injecting electrons into the active layer 43 through the substrate 41 and the buffer layer 42. Thereby, the carriers are accumulated in the undoped active layer 43 resulting in a recombination. There, the optical radiation that is released upon the recombination of the carriers propagates back and forth between the upper major surface of the contact layer 44 and the spherical surface of the microlens 41a, and there occurs a stimulated emission in the active layer 43. Thereby, a coherent optical beam is produced as usual in the laser diode.

In the laser diode of FIG. 4(A), it should be noted that the optical beam is confined effectively in the active layer 43 as well as in the contact layer 44 as these parts are surrounded laterally by the insulator layer 45 that has a reduced refractive index. On the other hand, when the optical beam enters into the buffer layer 42 and further into the substrate 41, there is no such optical confinement effect and the optical beam spreads by a diffraction. It should be noted that the effect of diffraction is substantial because of the reduced diameter of the active layer 43. When a flat mirror surface is used in correspondence to the lower major surface of the substrate 41 as in the conventional device, the optical beam is spread further upon reflection and the desired concentration of the optical beam in the active layer 43 is not obtained. Thereby, the efficiency of laser oscillation is inevitably reduced.

The present invention eliminates this problem of spreading of the optical beam by providing the microlens 41a. There, the divergent optical beam is reflected back by the concaved spherical surface of the microlens 41a and returns to the active layer 43 by passing the divergent optical path in the reversed direction. Thereby, the optical beam is concentrated in the active layer 43 and the stimulated emission is achieved in the active layer 43 with a significantly improved efficiency.

The device of FIG. 4(A) provides another advantageous feature in that the beam diameter of the optical beam that is obtained at the microlens 41a is increased substantially as compared with the optical beam that exits from the active layer 43. Typically, an optical beam having a beam diameter of 70 μm is obtained. Associated with this feature of increased beam diameter, the optical beam thus obtained experiences little diffraction and the unwanted spreading of the output optical beam is minimized. In the illustrated example of FIG. 4(A), a silicon nitride semi-transparent film 48 is provided on the spherical surface of the microlens.

FIG. 4(B) shows the intensity profile of the optical beam that is obtained from the microlens 41a. As long as the diameter of the active layer 43 is set in the range of 4 μm–10 μm, one obtains a substantially flat intensity profile. In FIG. 4(B), it should be noted that the vertical axis represents the optical intensity in the arbitrary scale while the horizontal axis corresponds to the lateral scale of FIG. 4(A). In order to obtain a single mode laser oscillation, it is preferable to set the diameter of the active layer 43 and hence the diameter of the contact layer 44 as small as possible. On the other hand, the excessive decrease of the diameter invites a difficulty at the time of fabrication. It should be noted that the insulator layer 45 may be provided for example by the spin-coating process of polyimide after the disc-shaped layers 43 and 44 are formed. At the outset, the diameter of these parts cannot be reduced below 5 μm because of the mechanical instability at the time of the spin-coating.

Next, the process for fabricating the microlens 41a of the device of FIG. 4(A) will be described in brief with reference to FIGS. 5(A)–5(D).

Figure 5A:
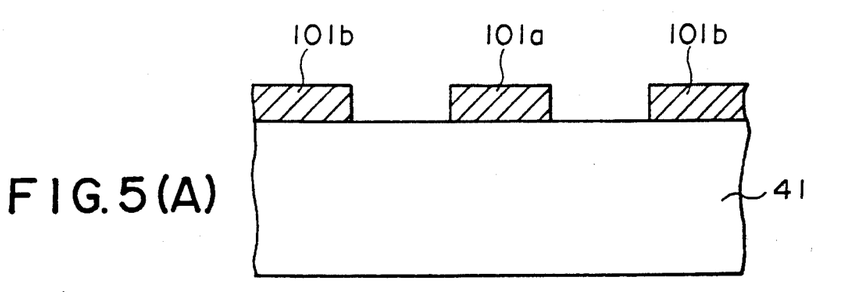
FIGS. 5(A)-5(D) are diagrams showing the process for forming a convex lens part in the device of FIG. 4(A)

Referring to the drawings, a photoresist is applied on the flat lower major surface of the substrate 41 and patterned subsequently to form a disk-shaped resist pattern 101a in correspondence to the microlens 41 to be formed. Further, a resist pattern 101b is formed to surround the disk-shaped pattern 101a. Typically, an AZ-type photoresist is used. In FIG. 5(A), it should be noted that the substrate 41 is shown upside down. In the present embodiment, the pattern 101a has a diameter of about 80 μm.

Figure 5B:
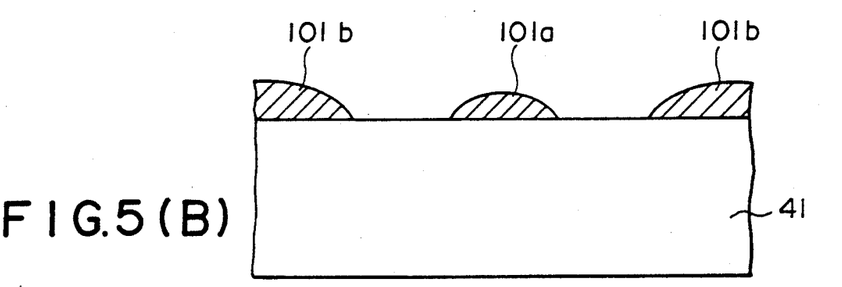

Next, in the step of FIG. 5(B), the structure of FIG. 5(A) is heated to a temperature of about 200° C. such that the patterned photoresist 101a and 101b undergo a reflowing. Thereby, the sharp edges of the resist patterns 101a and 101b are rounded as shown in FIG. 5(B). Particularly, the disk-shaped pattern 101a now assumes a spherical surface as a result of the reflowing.

Figure 5C:
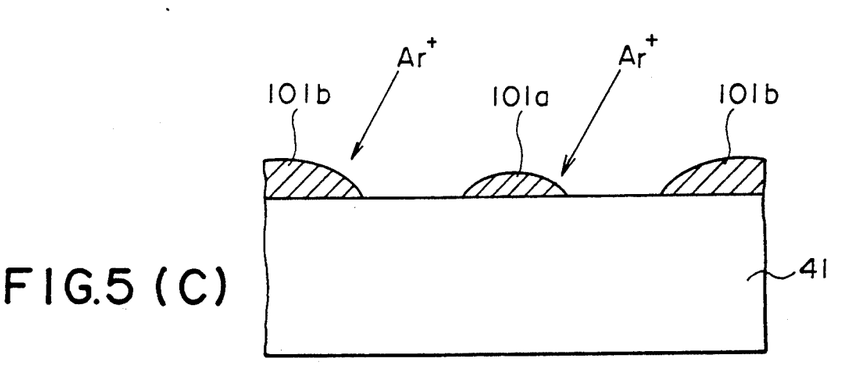
Figure 5D:
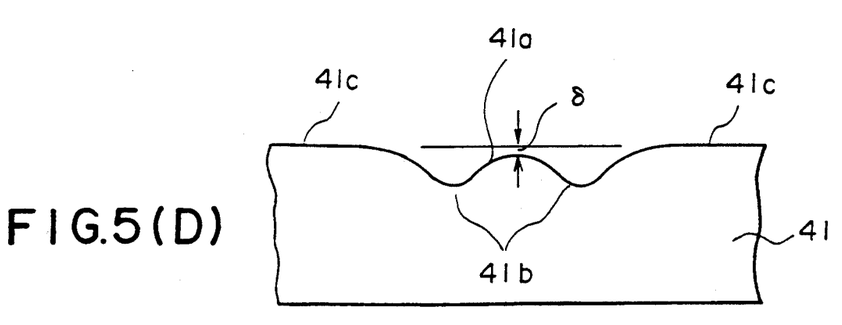

The structure thus obtained in the process of FIG. 5(B) is now subjected to an ion beam etching process as shown in FIG. 5(C), wherein the surface of the structure of FIG. 5(B) is bombarded by accelerated argon ions Ar+ while rotating the substrate about the center of the disc-shaped pattern 101a. Thereby, the exposed surface of the substrate 41 as well as the surface of the photoresist patterns 101a and 101b are etched by the Ar ions while maintaining the general morphology of the patterns 101a and 101b. Thereby, the microlens 41a is formed as shown in FIG. 5(D) such that the projecting surface of the microlens 41a is surrounded by a ring-shaped depression 41b. In correspondence to the part that is protected by the photoresist pattern 101b, a flat surface 41c is obtained.

It was found that, by providing the photoresist pattern 101b to surround the disk-shaped pattern 101a and applying an etching in this state, the spherical surface of the lens 41a does not protrude beyond the level of the surface 41c as indicated by δ in FIG. 5(D). This feature is particularly advantageous for protecting the microlens 41a in various situations which includes the step of placing the device on a support surface such that the lower major surface 41c contacts with the support surface.

The radius of the microlens 41a is determined by choosing the thickness of the resist pattern 101a appropriately. In the illustrated example, the thickness of the resist pattern 101a is set to about 3 μm. As demonstrated in the use of the microlens in the photodiode (Makiuchi et al., Fujitsu Sci. Tech., 27, pp. 84–91, April, 1991), the setting of the radius of the lens 41a is not critical to the operation of the laser diode.

Next, a surface radiation type laser diode 50 according to a second embodiment of the present invention will be described with reference to FIG. 6.

Figure 6:
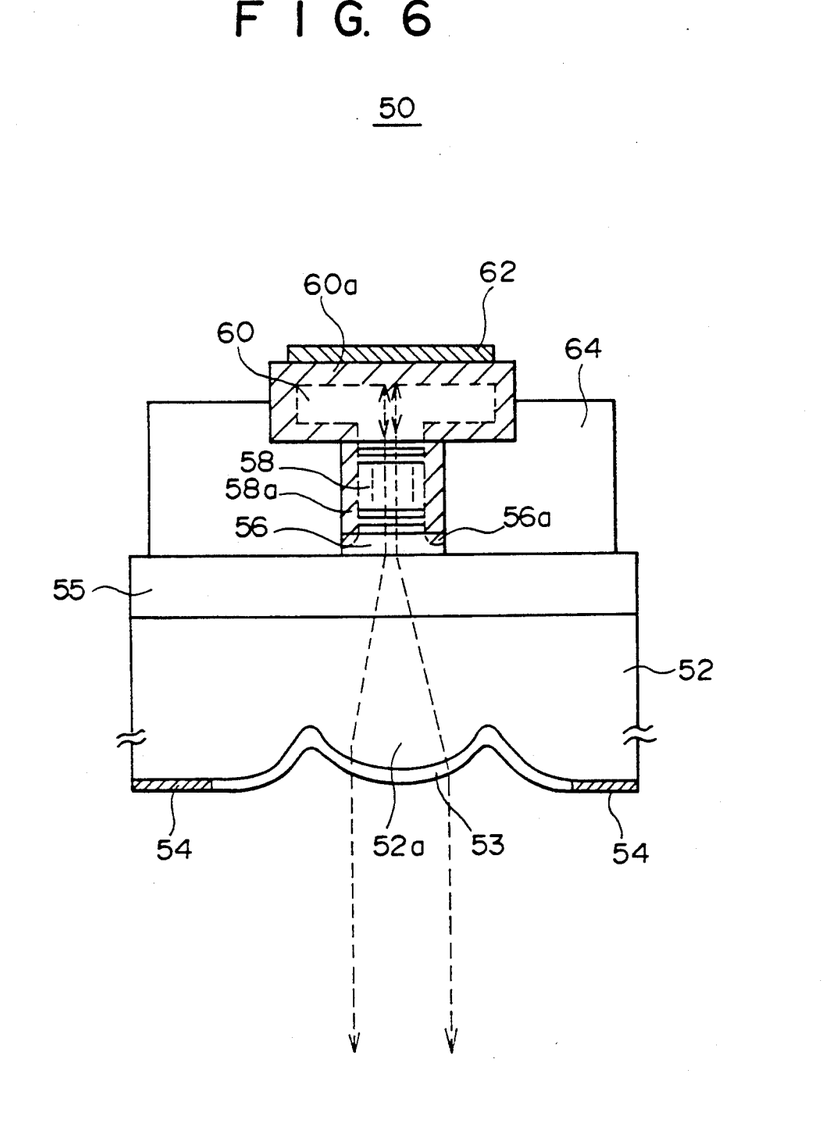
FIG. 6 is a diagram showing a surface radiation type laser diode according to a second embodiment of the present invention.

Referring to FIG. 6, the device 50 includes an n+-type InP substrate 52 that is similar to the substrate 41, and there is provided a microlens 52a on the lower major surface of the substrate 52 in correspondence to the microlens 41a of the previous embodiment. Further, a silicon nitride semi-transparent film 53 is provided on the spherical surface of the lens 52a in correspondence to the silicon nitride film 48, and an ohmic electrode 54 is provided on the lower major surface of the substrate 52 to surround the microlens 52a in correspondence to the ohmic electrode 49. On the upper major surface of the substrate 52, there is provided a buffer layer 55 of n+-type InP having the impurity concentration level of $1 \times 10^{18}$ cm$^{-3}$ – $7 \times 10^{18}$ cm$^{-3}$ similarly to the device 40, and an undoped carrier stopper layer 56 of InGaAs to be described later is grown on the buffer layer 55 with a thickness of 0.1–1 μm. The stopper carrier layer 56 has a disc-shape and has a lateral size of 5–10 μm in correspondence to the active layer 43 of the device 40.

On the stopper layer 56, a disc-shaped active layer 58 is provided with a diameter corresponding to the diameter of the stopper layer 56. In other words, the active layer 58 has a diameter of 5–10 μm. In the device 50 of the present embodiment, the active layer 58 has the MQW structure and includes an alternate stacking of an undoped InGaAs quantum well layer and an undoped InGaAsP barrier layer, wherein the stacking is repeated for 50 times, for example. Typically, each quantum well layer and each barrier layer have a same thickness of 10 nm. In this case, the layer 58 has a total thickness of 1 μm.

On the MQW active layer 58, there is provided a disc-shaped contact layer 60 of p+-type InP in correspondence to the contact layer 44 of the device 40, and a polyimide layer 64 is provided on the buffer layer 55 to support the active layer 58 and the contact layer 60 laterally, similarly to the polyimide layer 45 of the device 40. Further, there is provided an ohmic electrode 62 on the upper major surface of the contact layer 60 in correspondence to the electrode 46.

In the present embodiment, it should be noted that the active layer 58 is formed with a diffusion region 58a such that the diffusion region 58a surrounds the active layer 58 along the side wall. The diffusion region 58a is formed as a result of diffusion of Zn, and the MQW structure is erased in the active layer 58 in correspondence to the diffusion region 58a. In other words, the MQW structure is narrowed in the active layer 58 as a result of formation of the diffusion region 58a. A similar diffusion region 60a is formed to surround the contact layer 60. As a result of the formation of the diffusion region 58a, the steep change of the refractive index at the interface between the active layer 58 and the surrounding polyimide layer 64 is averaged, and the reflection of the optical beam at such an interface is substantially reduced. Thereby, the laser diode of the present embodiment is effective for suppressing the higher mode laser oscillation. In the device 50 of FIG. 6, the feature of the single mode laser oscillation is further enhanced by the reduction of the diameter of the MQW region in the active layer 58.

Figure 7A:
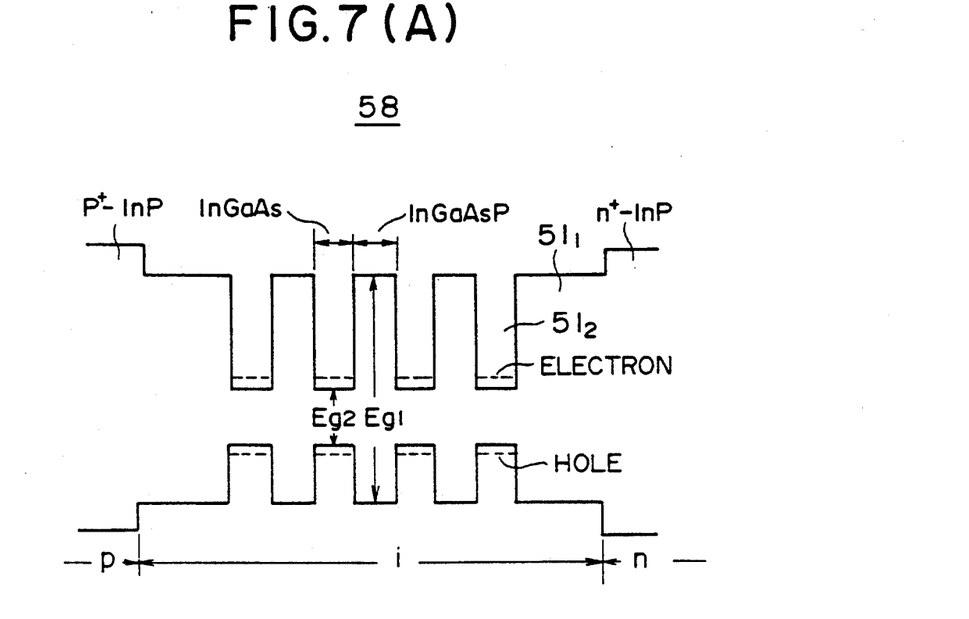
FIGS. 7(A) and 7(B) are diagrams showing the band structure of a MQW active layer used in the device of FIG. 6.
Figure 7B:
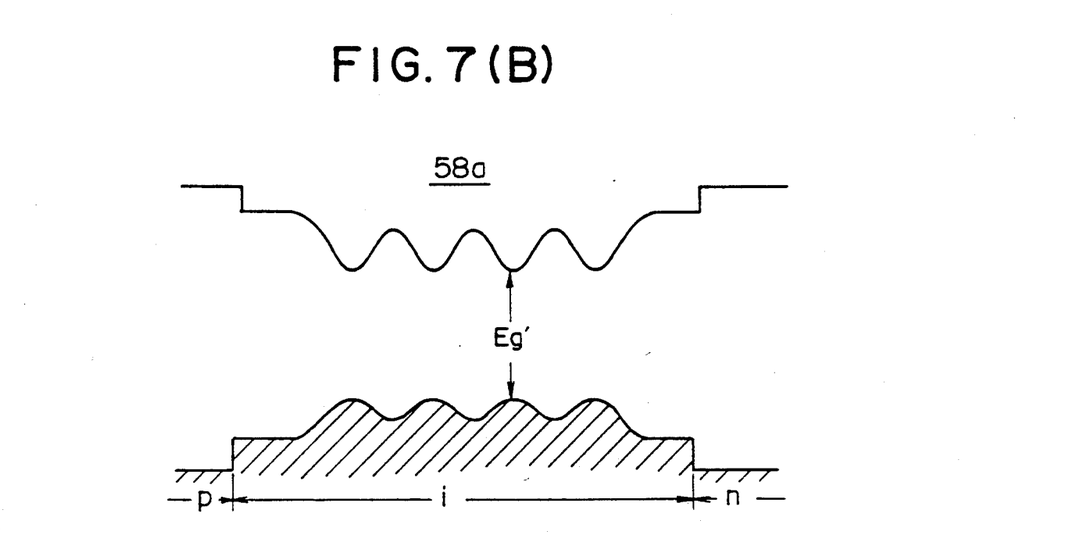

FIGS. 7(A) and 7(B) are diagrams respectively showing the band structure of the active layer 58 for the region wherein the original MQW structure remains unchanged and for the diffusion region 58a wherein the MQW structure is modified as a result of the diffusion of Zn.

Referring to FIG. 7(A) showing the well known band diagram of a typical MQW, it can be seen that there is an alternate repetition of a barrier layer $51_1$ of undoped InGaAsP and a quantum well layer $51_2$ of undoped InGaAs, wherein the barrier layer $51_1$ is characterized by a large band gap energy $Eg_1$ while the quantum well layer $51_2$ is characterized by a small band gap energy $Eg_2$ as usual. Further, there are formed a quantum level of electrons and a quantum level of holes in each quantum well layer $51_2$ as a result of the lateral confinement of the carriers. As usual in the MQW structure, the carriers are concentrated in the vicinity of the quantum levels in the device of the present embodiment, and an efficient layer oscillation is obtained. Further, the oscillation wavelength of the laser diode is set as desired by setting the thickness of the quantum well layer.

In the band diagram of FIG. 7(B), on the other hand, it will be seen that the band gap is substantially increased as a result of the diffusion of Zn that erases the quantum well structure. Associated therewith, the refractive index of the active layer 58 is reduced in correspondence to the diffusion region 58a to a value which is intermediate between the refractive index of the MQW part of the active layer 58 and the refractive index of the polyimide layer 64.

Summarizing the above, the laser diode of the present embodiment achieves an efficient laser oscillation as a result of combination cf the use of the MQW structure for the active layer 58 and the use of the microlens 52a for concentrating the optical beam in the active layer 58. Further, the device of the present embodiment facilitates the single mode oscillation by eliminating the reflection of the optical beam at the side wall of the active layer 58 by providing the diffusion region 58a and further by reducing the effective diameter of the MQW region in the active layer 58.

In the device of the present embodiment, the injection of the carriers to the MQW active layer 58 is achieved efficiently from the side wall of the layer 58. There, the holes that are injected at the electrode 62 are transported along the diffusion region 58a and further to the MQW layer 58 along the quantum well layers. There, the transport of the holes is achieved without overriding the potential barrier of the barrier layer $51_2$.

It should be noted that the flow of the holes directly from the diffusion region 58a to the buffer layer 55 is interrupted at the undoped carrier stopper layer 56 of InGaAs. Although there occurs a recombination of the carriers in the carrier stopper layer 51 to some extent, the majority of the carriers cause the recombination in the MQW region of the active layer 58 because of the preferential transport of the holes along the quantum well layers $51_2$.

Next, the fabrication process of the device of FIG. 6 will be described with reference to FIGS. 8(A)-8(E).

Figure 8A:
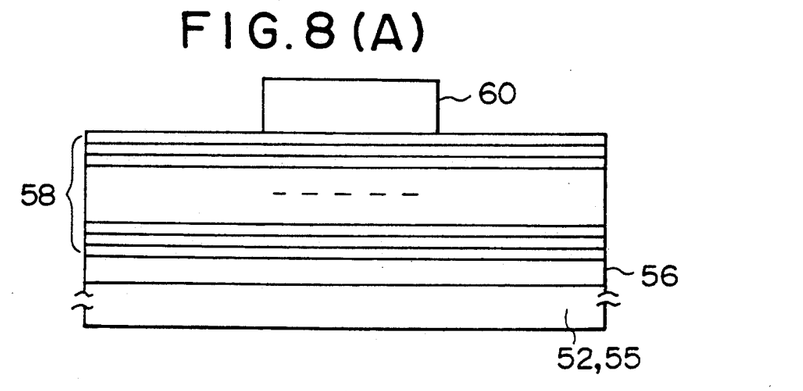
FIGS. 8(A)-8(E) are diagrams showing the process for forming the essential part of the device of FIG. 6.
Figure 8B:
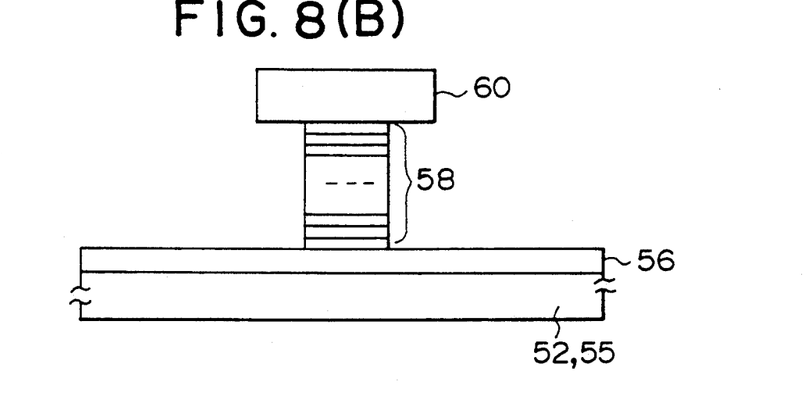
Figure 8C:
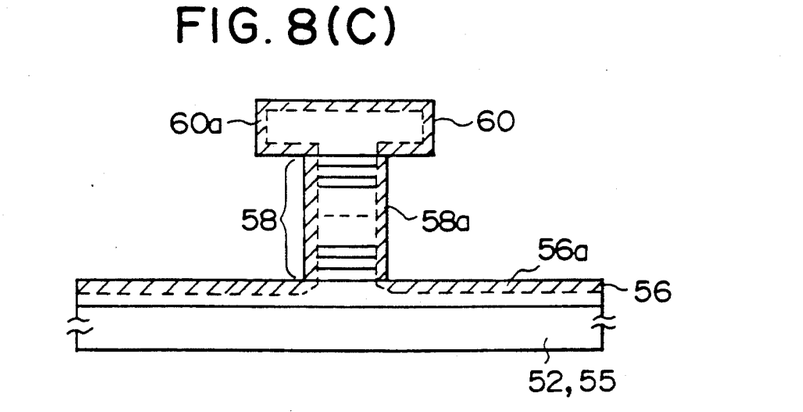

Referring to FIG. 8(A), the contact layer 60 grown on the MQW layer 58 is patterned by a selective layer 58. Such a selective etching may be achieved by using an etching solution of HCl and $H_2O$ (HCl:$H_2O$=1:1). Next, in the step of FIG. 8(B), the MQW layer 58 is subjected to a selective etching process against the layers 56 and 60 by using an etching solution of $HNO_3$ and HF ($HNO_3$:HF=1:1). Thereby, an inverted-T structure shown in FIG. 8(B) is obtained. Next, in the step of FIG. 8(C), a diffusion process of Zn is achieved and a diffusion region 58a is formed in correspondence to the patterned MQW layer 58. Simultaneously to the formation of the diffusion region 58a, the diffusion region 60a is formed in correspondence to the exposed surface of the contact layer 60. Further, a diffusion region 56a is formed on the exposed upper major surface of the stopper layer 56.

Figure 8D:
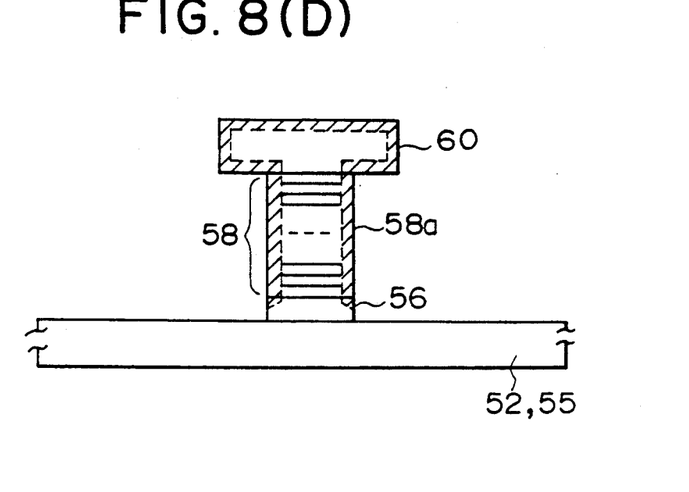
Figure 8E:
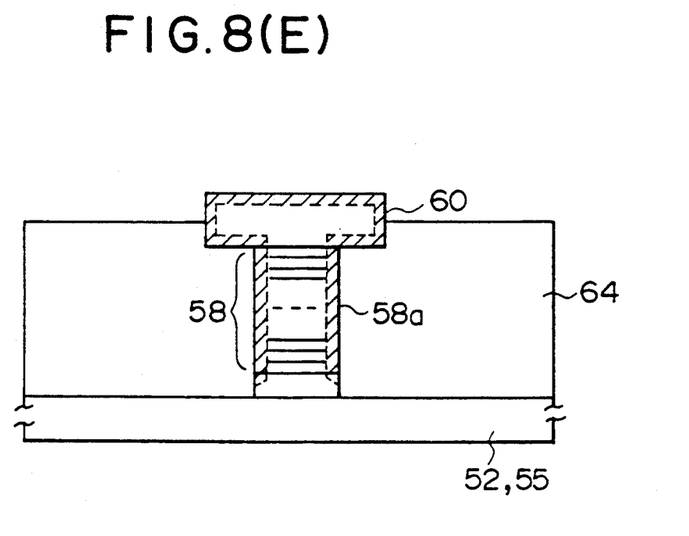

Next, the stopper layer 56 is patterned while using the inverted-T structure as a mask. Thereby, the structure shown in FIG. 8(D) is obtained. Further, the polyimide layer 64 is spin-coated and the structure shown in FIG. 8(E) that corresponds to the device of FIG. 6 is obtained.

Figure 9:
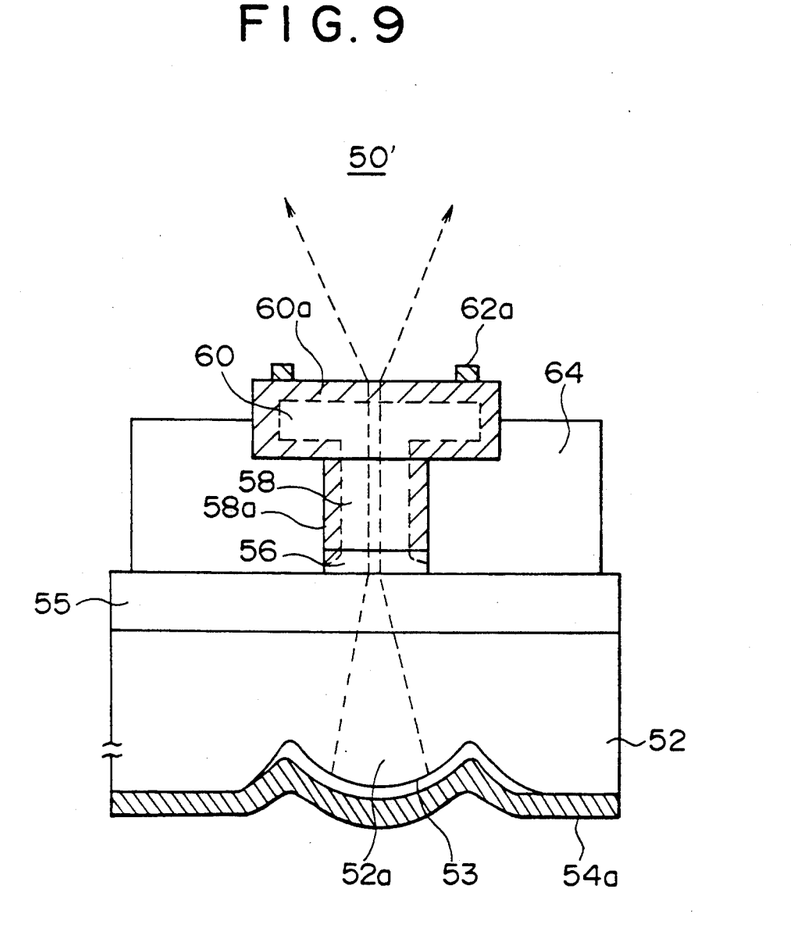
FIG. 9 is a diagram showing a modification the device of FIG. 6.

FIG. 9 shows a modification of the device of the second embodiment. The device has a structure similar to FIG. 9 except that the lower major surface of the substrate 52 is covered by an ohmic electrode 54a including the spherical surface of the microlens 52a. On the other hand, the ohmic electrode at the upper major surface of the contact layer 60 is formed into a ring-shape as shown by an ohmic electrode 62a, and the optical beam is emitted at the upper major surface of the contact layer 60. In this device, one can still obtain an efficient laser oscillation due to the concentration of the optical beam in the active layer 58 by the reflection at the microlens 52a. On the other hand, the optical beam that exits from the upper major surface of the contact layer 60 spreads substantially as a result of the diffraction.

Figure 10:
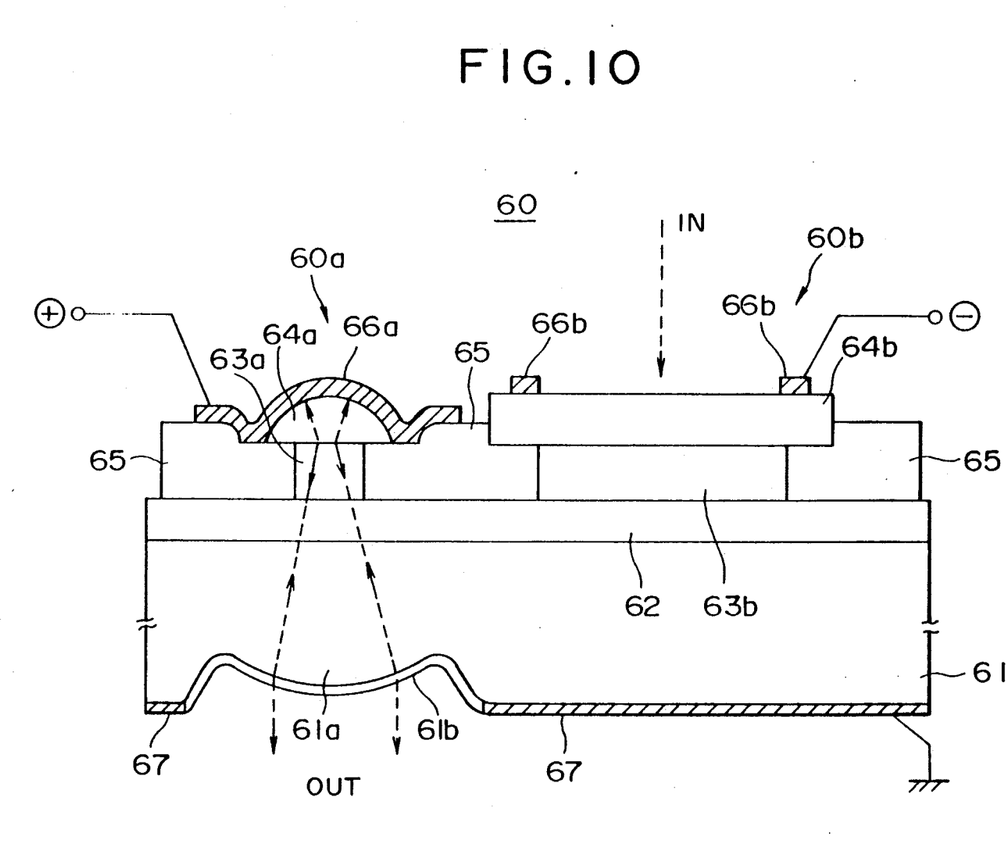
FIG. 10 is a diagram showing a laser diode according to a third embodiment of the present invention in a cross sectional view.

FIG. 10 shows a laser diode 60a according to a third embodiment of the present invention.

Referring to FIG. 10, the device 60a includes an $n^+$-type substrate 61 of InP corresponding to the substrate 41 and a buffer layer 62 of $n^+$-type InP grown epitaxially on the substrate 61. Further, the substrate 61 is formed with a microlens 61a similarly microlens 41a.

On the upper major surface of the buffer layer 62, there is provided an active layer 63a of undoped InGaAs in correspondence to the active layer 44, wherein the active layer 63a has a disc-shape similarly to the active layer 43.

The active layer 43 is supported laterally by a polyimide layer 65 that has an upper major surface substantially flush with the upper major surface of the active layer 63a, and there is provided a contact layer 64a of $p^+$-type InP on the upper major surface of the active layer 63a. It should be noted that the contact layer 63a has a spherical upper major surface and there is provided an ohmic electrode 66a similar to the ohmic electrode 46 to cover the spherical upper major surface of the contact layer 64a. Thereby, the optical beam is reflected back and forth between the two opposing spherical surfaces and is concentrated in the active layer 63a as indicated by the broken line that represents the optical path of the optical beam. Similar to the first and second embodiments, a large-diameter optical beam is outputted from the microlens 61a at the bottom of the substrate 61 in the form of the parallel optical beam. As usual, there is provided an anti-reflection coating 61b of silicon nitride on the spherical surface of the microlens 61a. In order to inject the electrons, there is provided an ohmic electrode 67 on the lower major surface of the substrate 61 except for the microlens 61a.

In the embodiment of FIG. 10, it should be noted that the substrate 61 and the buffer layer 62 extend laterally and there is provided another active layer 63b of undoped InGaAs on the lateral extension of the buffer layer 62. The active layer 62b has a disc-shape similar to the active layer 63a except that the layer 62b has a substantially larger diameter and hence a larger surface area as compared with the active layer 63b. On the active layer 63b, there is provided a contact layer 64b of a disc-shape with a diameter exceeding the diameter of the active layer 63a. Similarly to the contact layer 64a, the contact layer 64b comprises p+-type InP. Further, the polyimide layer 65 fills the space between the active layer 63a and the active layer 63b and supports the active layer 63b laterally. On the upper major surface of the contact layer 64b, there is provided a ring-shaped ohmic electrodes 66b while the ohmic electrode 67 covers the lower major surface of the substrate 61 in correspondence to the second active layer 63b. Thereby, there is formed a second optical semiconductor device 60b adjacent to the laser diode 60a.

In operation, a positive voltage is applied to the ohmic electrode 66a while a negative voltage is applied to the ohmic electrode 66b. Further, the ohmic electrode 67 at the lower major surface of the substrate 61 acts as a common electrode and is set at the zero-voltage level by connecting to the ground. Thereby, the device 60a is forward biased, while the device 60b is reverse-biased, and the device 60a acts as a laser diode while the device 60b acts as a photodetector.

Upon incidence of an optical beam to the upper major surface of the contact layer 64b, the holes created in the active layer 63b as a result of the optical excitation migrates toward the electrode 67 while experiencing the accelerating electric field established across the electrode 66b and the electrode 67. By setting the bias voltage suitably, one can cause an avalanche breakdown in the active layer 63b, and such an avalanche breakdown in turn produces optical radiation. In the device of FIG. 10, the optical radiation thus produced enters into the active layer 63a of the laser diode 60a and causes an optical pumping. In response to the optical pumping, the laser diode 60a starts to oscillate. In other words, the device 60 of FIG. 10 acts as an optical device that repeats the optical input. Of course, the laser diode 60a and the photodiode 60b can be used independently.

Further, the present invention is not limited to the embodiments described heretofore, but various variations and modifications may be made without departing from the scope of the invention.

What is claimed is:

1. A laser diode for producing an optical beam in a direction substantially perpendicular to epitaxial layers, comprising:

a substrate having an upper major surface and a lower major surface, said substrate comprising a single crystal of a first semiconductor material having a first conductivity tape, said substrate being surrounded by a first side wall with a first lateral size;

an active layer having an upper major surface and a lower major surface and provided on said upper major surface of said substrate epitaxially, said active layer being surrounded by said second side wall and having a second lateral size that is substantially smaller than said first lateral size, and active layer comprising an undoped single crystal of a second semiconductor material different from said first semiconductor material and producing an optical beam by a stimulated emission, said active layer having a first refractive index;

a contact layer having an upper major surface and a lower major surface and provided on said upper major surface of said active layer epitaxially, said contact layer being surrounded by a third side wall and having a third lateral size substantially smaller than said first lateral size, said contact layer comprising a third semiconductor material different from said second semiconductor material and doped to said first conductivity type, said contact layer having a second refractive index;

optical confinement means providing on said upper major surface of said substrate in contact with said second and third side walls for confining said optical beam in said active layer and in said contact layer, said optical confinement means comprising a material that has a third refractive index that is smaller than any of said first and second refractive indices;

a convex mirror part provided on said lower major surface on said substrate to protrude outward from said substrate in a direction substantially perpendicular to said lower major surface of said substrate, said convex mirror part comprising a spherical surface for reflecting back said optical beam and concentrating the same in said active layer;

a second mirror part provided in correspondence to said upper major surface of said contact layer for reflecting back said optical beam to said active layer;

first electrode means provided on said upper major surface of said contact layer for injecting carriers of a first polarity;

second electrode means provided on said lower major surface of said substrate for injecting carriers of a second, opposite polarity; and optical passage means provided at least on one of said spherical surface of said convex lens part and said upper major surface of said contact layer for emitting said optical beam, said convex mirror part and said second mirror part being arranged in opposing relationship, said substrate, said active layer and said contact layer being interposed between said mirror parts so as to present a resonant cavity.

2. A laser diode as claimed in claim 1 in which said second electrode means comprises an ohmic electrode provided in ohmic contact with said lower major surface of said substrate such that said ohmic electrode exposes said convex lens part.

3. A laser diode as claimed in claim 1 in which said second electrode means comprises an ohmic electrode provided in ohmic contact with said lower major surface of said substrate such that said ohmic electrode covers said convex lens part, said ohmic electrode acting as a spherical mirror surface.

4. A laser diode as claimed in claim 2 in which said first electrode means comprises a second ohmic electrode provided in ohmic contact with said upper major surface of said contact layer such that said second ohmic electrode covers substantially the entire upper major surface of said contact layer.

5. A laser diode as claimed in claim 1 in which said first electrode means comprises a ring-shaped ohmic electrode provided in ohmic contact with said upper major surface of said contact layer, said ring-shaped ohmic electrode exposing said upper major surface of said contact layer as a passage of the optical beam.

6. A laser diode as claimed in claim 1 in which said active layer has a disc-shape having a first diameter corresponding to said first lateral size, said active layer being provided substantially concentrically with respect to the convex lens part when viewed in a direction perpendicular to said substrate.

7. A laser diode as claimed in claim 6 in which said diameter of said convex lens part is substantially larger than said first diameter of said active layer, when viewed in a direction substantially perpendicular to said substrate.

8. A laser diode as claimed in claim 7 in which said first diameter of said active layer is set in a range between 5 $\mu$m to 10 $\mu$m, while said convex lens part has a diameter of about 80 $\mu$m when viewed in a direction perpendicular to said substrate.

9. A laser diode as claimed in claim 6 in which said contact layer has a disc-shape having a second diameter corresponding to said second lateral size, said contact layer being provided substantially concentrically with respect to said active layer.

10. A laser diode as claimed in claim 9 in which said second diameter is larger than said first diameter.

11. A laser diode as claimed in claim 1 in which said convex mirror part comprises a transparent layer covering said spherical surface for facilitating said optical beam to transmit through said spherical surface as a parallel optical beam.

12. A laser diode as claimed in claim 1 in which said upper major surface of said contact layer is provided with a third convex mirror part for reflecting back the optical beam such that the optical beam is concentrated in said active layer.

13. A laser diode as claimed in claim 1 in which said substrate comprises a first layer of InP having an upper major surface and a lower major surface that is coincident to said lower major surface of said substrate, and a second layer of InP grown epitaxially on said first layer, said second layer having a lower major surface coincident to said upper major surface of said first layer and an upper major surface that is coincident to said upper major surface of said substrate.

14. A laser diode as claimed in claim 1 in which said confinement means comprises a polyimide layer provided on said upper major surface of said substrate.

15. A laser diode as claimed in claim 1 in which said active layer includes a sleeve region along said second side wall for reducing a reflection of said optical beam at said second side wall, said sleeve region having a fourth refractive index that is intermediate between said first refractive index and said second refractive index.

16. A laser diode as claimed in claim 15 in which said active layer has a multiple quantum well structure including a quantum well layer of a first undoped semiconductor material and a barrier layer of a second undoped semiconductor layer, said quantum well layer being characterized by discrete quantum levels, wherein said multiple quantum well structure is modified in correspondence to said sleeve region.

17. A laser diode as claimed in claim 16 in which said sleeve region comprises a region that is doped with an impurity element to said second conductivity type.

18. A laser diode as claimed in claim 17 in which said active layer further comprises an undoped semiconductor layer between said substrate and said multiple quantum well structure.

* * * * *

UNITED STATES PATENT AND TRADEMARK OFFICE
CERTIFICATE OF CORRECTION

PATENT NO. : 5,309,468
DATED : May 3, 1994
INVENTOR(S) : MASAO MAKIUCHI

It is certified that error appears in the above-indentified patent and that said Letters Patent is hereby corrected as shown below:

Title Page, Other Publications, line 3, delete "Gain" and substitute --GaIn--;

line 8, delete "Nec" and substitute --NEC--;

Title Page, column 2, line 9, delete "GalnAs" and substitute --GaInAs--

Column 5, line 63, after "43" insert --.--.

Column 9, line 63, after "selective" insert --etching process achieved selectively against the MQW--.

Column 10, line 43, delete "similarly" and substitute --similar--.

Column 11, line 58, delete "tape" and substitute --type--.

Signed and Sealed this

Thirteenth Day of September, 1994

Attest:

BRUCE LEHMAN

Attesting Officer    Commissioner of Patents and Trademarks